(12) United States Patent
Takahashi et al.

(10) Patent No.: US 9,346,715 B2
(45) Date of Patent: May 24, 2016

(54) LANTHANUM HEXABORIDE SINTERED BODY, TARGET AND LANTHANUM HEXABORIDE FILM EACH COMPRISING SAME, AND PROCESS FOR PRODUCTION OF THE SINTERED BODY

(75) Inventors: Kentaro Takahashi, Chiba (JP); Kazuto Andou, Chiba (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 842 days.

(21) Appl. No.: 13/637,812

(22) PCT Filed: Feb. 2, 2011

(86) PCT No.: PCT/JP2011/052178
§ 371 (c)(1),
(2), (4) Date: Sep. 27, 2012

(87) PCT Pub. No.: WO2011/122100
PCT Pub. Date: Oct. 6, 2011

(65) Prior Publication Data
US 2013/0017137 A1    Jan. 17, 2013

(30) Foreign Application Priority Data
Mar. 29, 2010    (JP) .................................. 2010-076034

(51) Int. Cl.
*C01B 35/04*    (2006.01)
*C04B 35/58*    (2006.01)
(Continued)

(52) U.S. Cl.
CPC ........... *C04B 35/5805* (2013.01); *C04B 35/645* (2013.01); *C23C 14/067* (2013.01); *C23C 14/3414* (2013.01); *C23C 14/35* (2013.01); *C04B 2235/3804* (2013.01); *C04B 2235/3895* (2013.01); *C04B 2235/5436* (2013.01); *C04B 2235/656* (2013.01); *C04B 2235/6567* (2013.01); *C04B 2235/721* (2013.01); *C04B 2235/722* (2013.01); *C04B 2235/723* (2013.01); *C04B 2235/761* (2013.01); *C04B 2235/77* (2013.01)

(58) Field of Classification Search
None
See application file for complete search history.

(56) References Cited

U.S. PATENT DOCUMENTS 4,661,740 A    4/1987    Knoch et al.

FOREIGN PATENT DOCUMENTS

| JP | 52098632 A * | 8/1977 | ............. C23C 13/12 |
| JP | 55 140715 | 11/1980 | |

(Continued)

OTHER PUBLICATIONS

JP 52-98632 English Abstract from Derwent, Aug. 1977.*

(Continued)

*Primary Examiner* — Colin W Slifka
(74) *Attorney, Agent, or Firm* — Oblon, McClelland, Maier & Neustadt, L.L.P.

(57) ABSTRACT

Disclosed are: a lanthanum hexaboride sintered body which contains lanthanum hexaboride as the main component, has an element nitrogen content of 0.1 to 3 mass % inclusive, contains an impurity composed of element carbon and/or at least two elements selected from La, C, O and B at a content of 0.3 vol % or less, and has a relative density of 88% or more; and a target comprising the lanthanum hexaboride sintered body. An $LaB_6$ sintered body can be provided, which enables the production of a highly pure and dense $LaB_6$ thin film having excellent crystallinity and a good work function and which is suitable for a sputtering target or the like.

21 Claims, 1 Drawing Sheet

(51) Int. Cl.
*C04B 35/645* (2006.01)
*C23C 14/06* (2006.01)
*C23C 14/34* (2006.01)
*C23C 14/35* (2006.01)

(56) References Cited

FOREIGN PATENT DOCUMENTS

| JP | 58 95652 | 6/1983 |
| JP | 61 261272 | 11/1986 |
| JP | 4 228474 | 8/1992 |
| JP | 6 248446 | 9/1994 |
| JP | 8 12417 | 1/1996 |
| WO | 2010 001796 | 1/2010 |

OTHER PUBLICATIONS

WO 2010-001796 English Machine Translation from WIPO, Translated Oct. 22, 2015.*

Nakahara, M., "Muki Kagobutsu Sakutai Jiten," Kodansha Ltd., p. 933, (Jun. 10, 1997).

International Search Report Issued Apr. 5, 2011 in PCT/JP11/52178 Filed Feb. 2, 2011.

* cited by examiner

LANTHANUM HEXABORIDE SINTERED BODY, TARGET AND LANTHANUM HEXABORIDE FILM EACH COMPRISING SAME, AND PROCESS FOR PRODUCTION OF THE SINTERED BODY

TECHNICAL FIELD

The present invention relates to a lanthanum hexaboride ($LaB_6$) sintered body, a target formed of the same, a lanthanum hexaboride film formed by using the same, and a method of producing the sintered body. More specifically, the present invention relates to an $LaB_6$ sintered body with high purity and high density, which is suitable as a sputtering target and the like for manufacturing an $LaB_6$ film with excellent crystallinity and good work function, a target formed of this $LaB_6$ sintered body, a lanthanum hexaboride film formed by using the target, and a method of effectively producing the $LaB_6$ sintered body.

BACKGROUND ART

Metal borides are chemically stable and exhibit various electric properties according to the content of boron. Thus, it is expected that a variety of applications would be developed. Among them, especially lanthanum hexaboride ($LaB_6$) has low work function. Accordingly, the application has further been developed as an electrode material in an electron emitter, a light, and the like. The work function indicates minimum energy necessary for taking out electrons from the surface of material. The lower work function of an electron emitter is more preferable.

The $LaB_6$ is often used as a film. Various methods of producing the $LaB_6$ film have been examined. Among these methods, the sputtering method of producing a dense film by using an $LaB_6$ target is suitably used. The $LaB_6$ film should have high purity and high crystallinity in order to have a lower work function.

Generally, the target should have high density and high purity. A conventional $LaB_6$ target is produced by sintering a commercially available $LaB_6$ powder.

However, the commercially available $LaB_6$ powder contains lanthanum oxide, boron oxide, and lanthanum-boron complex oxide as impurities in 1.5 mass % or more in oxygen equivalent and lanthanum carbide and boron carbide in 0.2 mass % or more in carbon equivalent.

Lanthanum oxide and boron oxide contained in a commercially available $LaB_6$ powder is $LaB_6$ oxidized mainly with oxygen of the atmosphere. The industrial manufacturing process of a commercially available $LaB_6$ powder requires the process of pulverizing synthesized powder to have a particle-size suitable as the raw material of a sintered body, so that it is realistically impossible to handle $LaB_6$ powder completely free from the atmosphere. The fracture surface newly generated by this pulverization reacts with oxygen of the atmosphere so as to be lanthanum oxide or boron oxide.

Lanthanum boron complex oxide contained to a commercially available $LaB_6$ powder is generated by reacting lanthanum oxide contained in various La raw materials with boron oxide contained in B raw material during the synthesis of a commercially available $LaB_6$ powder.

On the other hand, lanthanum carbide and boron carbide are generated due to carbon added during the synthesis. The carbon is added to reduce various La raw materials into La metals reactable with B during the synthesis. Since excessive carbon is usually added to react with La completely, the remaining carbon is reacted with La and B to be lanthanum carbide and boron carbide respectively. It is realistically impossible to avoid the generation of these carbides. Therefore, it is very difficult to avoid lanthanum oxide, boron oxide, lanthanum boron complex oxide, lanthanum carbide, boron carbide, and residual carbon from being contained in a commercially available $LaB_6$ powder manufactured by an industrial production method.

Impurities contained in these $LaB_6$ powder cannot be removed even by being heated at a sintering temperature, remaining in the grain boundary of an $LaB_6$ sintered body. Accordingly, a conventional $LaB_6$ sintered body produced by using a commercially available $LaB_6$ powder contains impurities derived from the raw powder in at least 3 volume %. Impurities contained to the target are directly incorporated in a sputtering film. Since the impurities have a higher work function than $LaB_6$, the work function of an $LaB_6$ film containing such impurities is increased.

Therefore, there has been the problem in which the use of a conventional $LaB_6$ target produced by sintering a commercially available $LaB_6$ powder increases the impurity content of the obtained $LaB_6$ film resulting in a higher work function.

To decrease the impurity content of the target, the method of sintering $LaB_6$ powder with high purity is effective. The impurities contained in $LaB_6$ powder can be effectively removed by being hot-cleaned with an inorganic acid. The use of a target highly purified by this acid cleaning can form an $LaB_6$ film with a small amount of impurities.

On the other hand, an $LaB_6$ film has been examined for application to an electron emitter, an electrode material, and the like. For this $LaB_6$ film, a metal substrate, a glass substrate, an Si wafer, and the like are mainly used for a film-formed substrate. There has been the problem in which when a highly purified $LaB_6$ sintered body is used for a target to form a film on the substrate, the obtained film has high purity but poor crystallinity and high work function and thus is peeled easily.

Generally, when a film is formed by sputtering on a film-formed substrate with a composition and a crystal structure which are different from those of a film respectively, the internal stress is generated in a sputtering film due to the difference in the physical properties of between the substrate and the film, resulting in the poor crystallinity of the film.

This phenomenon occurs even on an $LaB_6$ sputtering film, depending on the material of a substrate. This tendency is significant when the coefficient of thermal expansion and the lattice constant are substantially different from those of $LaB_6$. The crystallinity of an $LaB_6$ film deteriorates as the internal stress of the film is increased. It is known that the crystallinity of a film is related to the work function. Thus, the decrease of the crystallinity leads to the increase of the work function. Furthermore, a film is peeled easily from the substrate as the internal stress of a film is increased, so that it is impossible to form the film.

When an $LaB_6$ sputtering film contains impurities capable of alleviating the respective differences in the coefficient of thermal expansion and the lattice constant of between $LaB_6$ and a substrate, the internal stress of the film can be decreased.

However, such impurities have a higher work function than $LaB_6$. Thus, impurities contained an $LaB_6$ film relax the internal stress of the film but cannot avoid the work function from being increased.

Therefore, a target material capable of producing an $LaB_6$ sputtering film with high adhesion and high crystallinity has been desired, which does not contain impurities increasing the work function but alleviates the difference in the thermal expansion between $LaB_6$ and a substrate.

Furthermore, due to the sintering resistance of LaB$_6$, a conventional LaB$_6$ target formed by sintering a commercially available powder has only a relative density of about 80% and a large number of pores. An organic component, water, and the like are typically adsorbed in these pores. Then, a problem arises, in which during sputtering, this organic component and water are discharged in a vacuum chamber to contaminate the chamber and then are incorporated in a sputtering film to cause degradation of the film. To curb the influence of these pores, the LaB$_6$ spatter target has preferably a relative density of 88% or more.

There is a method of densifying a sintered body by sintering lanthanum hexaboride powder to which a sintering additive is added (for example, see PLTs 1 and 2). In this case, since metal oxide is typically used as a sintering additive, the metal oxide remains in the sintering body as impurities after sintering. When this sintered body is used as a target material, the impurities in the sintering body are incorporated in a sputtering film to cause degradation of the film.

On the other hand, a target for sputtering using metal boride containing one kind or more selected from hafnium boride, titanium boride, tungsten boride, and lanthanum hexaboride in major proportions and a method of producing the same is disclosed, in which the density ratio of the sintering body is 80% or more and in which the crystal size is 50 μm or less (for example, see PLT 3).

This technology obtains a high density boride target by significantly decreasing the interparticle spaces to improve the relative density. This technology is to improve the mass production of the products manufactured by using this target but does not mention the high purification of the target.

CITATION LIST

Patent Literature

PLT 1: Japanese Unexamined Patent Application Publication No. S61-261272
PLT 2: Japanese Unexamined Patent Application Publication No. H4-228474
PLT 3: Japanese Unexamined Patent Application Publication No. H6-248446

DISCLOSURE OF THE INVENTION

The inventors have made an effort to study a method of effectively producing metal boride sintered body with high purity and high density suitable as the constituent material of a target for sputtering, in particular, an LaB$_6$ sintered body capable of obtaining a lanthanum hexaboride film with low work function. As a result, the inventors have found that the method of sintering lanthanum hexaboride powder cleaned in an inorganic acid is effective for obtaining a lanthanum hexaboride sintered body with high purity.

When metallic boride powder is cleaned in an inorganic acid, metal oxide, boron oxide, and lanthanum boron complex oxide contained as impurity oxide dissolve in an inorganic acid, but metal carbide or boron carbide contained as impurity carbide do not dissolve in an inorganic acid. The inventors have found that metal boride powder is oxidized by being heated at a specific temperature in the atmosphere to oxidize the impurity carbide and then that this oxidized powder is acid-cleaned to be able to remove oxidized impurity carbide.

However, the LaB$_6$ sputtering film formed by using the target formed of the LaB$_6$ sintered body with high purity obtained by the above-mentioned technology limits applicable substrates. When the physical properties of a film-formed substrate is substantially different from those of LaB$_6$ as described above, the properties of an obtained sputtering film were insufficient.

The present invention is achieved in these circumstances and has an object to provide an LaB$_6$ sintered body with high purity and high density, which is suitable as a sputtering target and the like for manufacturing an LaB$_6$ film with excellent crystallinity and good work function, a target formed of this LaB$_6$ sintered body, a lanthanum hexaboride film formed by using the target, and a method of effectively producing the LaB$_6$ sintered body.

As described above, generally, when a film is formed by sputtering on a film-formed substrate with a composition or a crystal structure which are different from those of this film, the internal stress is generated in the sputtering film due to the difference in the physical properties of between the substrate and the film, causing the poor crystallinity of the film and then resulting in the film being peeled.

The inventors have focused attention on the fact that the LaB$_6$ crystal lattice is distorted by other elements solid-dispersed in a sintering body for a target, and then this distortion relaxes the internal stress while a sputtering film is formed. As a result of making an effort for further studies, the inventors have found that the internal stress of a sputtering film is relaxed by solid dispersing nitrogen in an LaB$_6$ sintered body.

Impurities increasing the work function of LaB$_6$ exist as the mixture with LaB$_6$ while nitrogen is solid dispersed in the lattices of the LaB$_6$ sintered body. By using such an LaB$_6$ sintered body for a target, in which nitrogen is solid-dispersed, an LaB$_6$ sputtering film in which nitrogen is solid dispersed is formed. The inventors have found that the solid dispersion amount of nitrogen in a sputtering film is not necessarily equal to that of nitrogen in the LaB$_6$ sintered body for a target and that the LaB$_6$ sintered body for a target, containing nitrogen in 0.1 mass % or more and 3.0 mass % or less increases the crystallinity of an LaB$_6$ sputtering film.

Furthermore, the inventors have found that an LaB$_6$ sintered body containing nitrogen in a content falling within the above-mentioned range and impurities consisting of carbon alone and/or at least two kinds of elements selected from La, C, O, and B in 0.3 volume % or less, has high purity and a relative density of 88% or more which is highly dense, and is suitable as a sputtering target and the like to produce a good LaB$_6$ film with excellent crystallinity and good work function.

This LaB$_6$ sintered body can be effectively produced by using LaB$_6$ powder as the raw material in a specific process.

The present invention is achieved based on these findings.

Specifically, the present invention is to provide:

[1] a lanthanum hexaboride sintered body comprising: nitrogen elements in 0.1 mass % or more and 3 mass % or less; and impurities consisting of carbon alone and/or at least two kinds of elements selected from La, C, O, and B in 0.3 volume % or less, wherein the relative density is 88% or more.

[2] the lanthanum hexaboride sintered body according to [1], further comprising carbon in less than 0.1 mass % and oxygen in less than 1.0 mass %.

[3] the lanthanum hexaboride sintered body according to [1] or [2], wherein the lattice constant is 4.1570 Å or more and 4.1750 Å or less.

[4] a target formed of the lanthanum hexaboride sintered body according to [1] or [2].

[5] a lanthanum hexaboride film formed by sputtering of the target according to [4], wherein the work function determined by ultraviolet ray photoelectron spectroscopy is 3.1 eV or less.

[6] a method of producing the lanthanum hexaboride sintered body according to [1] or [2], comprising the steps of: (a) heating lanthanum hexaboride powder at a temperature of 600° C. or more and 800° C. or less in the atmosphere, (b) carrying out acid treatment of the heated lanthanum hexaboride powder obtained in the step (a), (c) sintering the acidized lanthanum hexaboride powder obtained in the step (b) on the condition of a temperature of 1800° C. or more and a pressure of 30 MPa or more under a nitrogen gas atmosphere, wherein the oxygen content is adjusted to less than 1.0 mass %, and the carbon content is adjusted to less than 0.1 mass % in the acidized lanthanum hexaboride powder obtained in the step (b)

[7] the method according to [6], wherein the acidized lanthanum hexaboride powder obtained in the step (b) has a mean particle size of 1 μm or more and 5 μm or less,
further including the step (b') between the steps (b) and (c) of obtaining mixed powder by mixing the acidized lanthanum hexaboride powder with lanthanum hexaboride microscopic powder with a mean particle size of 50 nm or more and 500 nm or less,
wherein, in the step (c), the mixed powder is sintered on the condition.

[8] the method according to [7], wherein in the step (b'), the acidized powder with a mass of $M_N$ is mixed with the lanthanum hexaboride microscopic powder with a mass of $M_S$ in a mass ratio ($M_N/M_S$) of from 97/3 to 70/30.

[9] the method according to [7], wherein the lanthanum hexaboride microscopic powder is obtained by carrying out thermal-reduction of a lanthanum-containing compound and a boron-containing compound at a temperature of 1200° C. or more and 1500° C. or less in vacuum or under an inert gas atmosphere and then decreasing impurities in the obtained product.

[10] the method according to [7], wherein the lanthanum hexaboride sintered body is a sintered body for a target.

[11] a target formed of the lanthanum hexaboride sintered body according to [3].

[12] a lanthanum hexaboride film formed by sputtering of the target according to [11], wherein the work function determined by ultraviolet ray photoelectron spectroscopy is 3.1 eV or less.

[13] a method of producing the lanthanum hexaboride sintered body according to [3], comprising the steps of: (a) heating lanthanum hexaboride powder at a temperature of 600° C. or more and 800° C. or less in the atmosphere, (b) carrying out acid treatment of the heated lanthanum hexaboride powder obtained in the step (a), (c) sintering the acidized lanthanum hexaboride powder obtained in the step (b) on the condition of a temperature of 1800° C. or more and a pressure of 30 MPa or more under a nitrogen gas atmosphere, wherein the oxygen content is adjusted to less than 1.0 mass %, and the carbon content is adjusted to less than 0.1 mass % in the acidized lanthanum hexaboride powder obtained in the step (b)

[14] the method according to [13], wherein the acidized lanthanum hexaboride powder obtained in the step (b) has a mean particle size of 1 μm or more and 5 μm or less,
further including the step (b') between the steps (b) and (c) of obtaining mixed powder by mixing the acidized lanthanum hexaboride powder with lanthanum hexaboride microscopic powder with a mean particle size of 50 nm or more and 500 nm or less,
wherein, in the step (c), the mixed powder is sintered on the condition.

[15] the method according to [14], wherein in the step (b'), the acidized powder with a mass of $M_N$ is mixed with the lanthanum hexaboride microscopic powder with a mass of $M_S$ in a mass ratio ($M_N/M_S$) of from 97/3 to 70/30.

[16] the method according to [14], wherein the lanthanum hexaboride microscopic powder is obtained by carrying out thermal-reduction of a lanthanum-containing compound and a boron-containing compound at a temperature of 1200° C. or more and 1500° C. or less in vacuum or under an inert gas atmosphere and then decreasing impurities in the obtained product.

[17] the method according to [14], wherein the lanthanum hexaboride sintered body is a sintered body for a target.

The present invention can provide an $LaB_6$ sintered body with high purity and high density, which is suitable as a sputtering target and the like for manufacturing an $LaB_6$ film with excellent crystallinity and good work function, a target formed of this $LaB_6$ sintered body, a lanthanum hexaboride film formed by using the target, and a method of effectively producing the $LaB_6$ sintered body.

PREFERRED MODE FOR CARRYING OUT THE INVENTION

Figure 1:
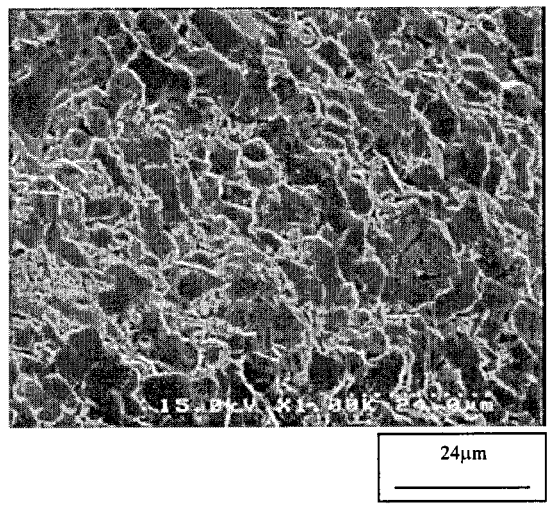
FIG. 1 shows a scanning electron microscope (referred to as "SEM") image of the $LaB_6$ sintered body of Example 1.

The $LaB_6$ sintered body of the present invention will be explained below.
$LaB_6$ Sintered Body
The $LaB_6$ sintered body of the present invention includes nitrogen elements in 0.1 mass % or more and 3 mass % or less and impurities consisting of carbon alone and/or at least two kinds of elements selected from La, C, O, and B in 0.3 volume % or less, in which the relative density is 88% or more.
Solid-Dispersion of Nitrogen Elements in the Lattices of $LaB_6$ Sintered Body
Generally, when a film is formed by sputtering on a film-formed substrate with a composition or a crystal structure which are different from those of this film is formed, a problem arises, in which the internal stress is generated in the sputtering film due to the difference in the physical properties of between the substrate and the film, causing the poor crystallinity of the film and thus resulting in the film being peeled.
In the $LaB_6$ sintered body of the present invention, nitrogen elements are solid-dispersed in the crystal lattices of $LaB_6$ of the sintered body to relax the internal stress of a sputtering film, resulting in the improved crystallinity, so as to address with such a problem. The content of nitrogen elements in the $LaB_6$ sintered body of the present invention should be 0.1 mass % or more and 3.0 mass % or less. If this nitrogen content is less than 0.1 mass %, the distortion of the crystal lattices of $LaB_6$ is low, so that the internal stress of a film caused by the difference in the physical properties of between a film-formed substrate and an $LaB_6$ film cannot be relaxed enough, resulting in the unimproved crystallinity of an $LaB_6$ sputtering film. If the nitrogen content exceeds 3 mass %, the distortion of the crystal lattices of $LaB_6$ is equal to or higher than the relaxable internal stress of film, causing the poor crystallinity of an $LaB_6$ sputtering film. Based on this viewpoint, the content of nitrogen elements is preferably 0.1 mass % or more and 2.0 mass % or less, more preferably 0.2 mass % or more and 1.0 mass % or less.

The nitrogen element belongs to the group 15 (long period) of the periodic table. The other elements (P, As, Sb, Bi) of the group 15 except the nitrogen element are not solid-dispersed in $LaB_6$ or do not obtain the same result as that from the solid-dispersed nitrogen even if solid-dispersed. This reason is considered that due to the remarkably large van der waals radius of the elements of the group 15 except the nitrogen element, the crystal lattices of $LaB_6$ are distorted too much when the elements of the group 15 except the nitrogen element exist so that the internal stress of a film caused by the difference in the properties of between a film-formed substrate and an $LaB_6$ film cannot be relaxed. On the other hand, the nitrogen with a small Van der waals radius is solid-dispersed in the crystal lattices of $LaB_6$ comparatively easily.

Furthermore, since the elements of the group 15 have a higher work function than $LaB_6$, the work function of an $LaB_6$ film is increased when the elements of the group 15 that cannot be solid-dispersed exist in the $LaB_6$ film. However, it has been found that a small amount of solid-dispersed nitrogen elements do not greatly change the crystal structure, resulting in very little influence on the work function of $LaB_6$.

Therefore, the internal stress of a sputtering film can be relaxed without influence on the work function by solid-dispersing nitrogen.

Nitrogen solid-dispersed in an $LaB_6$ sintered body basically generates an interstitial solid solution in which nitrogen is intruded in the gap between the atoms of the $LaB_6$ crystal lattice. When generated, an interstitial solid solution has a lattice constant larger than a non-solid solution. Thus, the lattice constant of an $LaB_6$ sintered body evaluated by the X-ray diffraction method (referred to as "XRD") can determine that nitrogen elements are solid-dispersed in the lattices of the $LaB_6$ sintered body.

The content of nitrogen elements does not necessarily have a definite relationship to the lattice constant of an $LaB_6$ sintered body. However, when the content of nitrogen elements is 0.1 mass % or more and 3 mass % or less, the lattice constant of an $LaB_6$ sintered body is preferably maintained in 4.1570 Å or more and 4.1750 Å or less in order to obtain a sputtering film superior with excellent crystallinity. It is more preferred that the content of nitrogen elements be 1 mass % or less and that the lattice constant be 4.1590 Å or less to obtain an $LaB_6$ sputtering film with superior crystallinity.

The content of nitrogen elements in an $LaB_6$ sintered body can be determined by adding the ground sintered body in a graphite crucible, heating and melting the sintered body in He gas inside a combustion tube, and measuring nitrogen in the generated gas by the thermal conductivity technique.

The method of solid-dispersing nitrogen elements in the lattices of an $LaB_6$ sintered body will be explained in the below-mentioned description on the method of producing an $LaB_6$ sintered body of the present invention.

Impurities

The lanthanum hexaboride sintered body of the present invention should contain impurities consisting of carbon alone and/or at least two kinds of elements selected from La, C, O, and B in 0.3 volume % or less.

If this impurity content of the lanthanum hexaboride sintered body exceeds 0.3 volume %, the impurity content of a target obtained by using the $LaB_6$ sintered body is increased. Thus, the impurities are incorporated in the sputtering film, so that an $LaB_6$ film with high purity and excellent crystallinity can not be obtained. The impurity content of the lanthanum hexaboride sintered body is preferably 0.2 volume % or less, more preferably 0.1 volume % or less.

The content of impurities in the $LaB_6$ sintered body is determined based on the area ratio of the impurity phase in the visual field by SEM observation. The size of one visual field is 720 μm×940 μm. The area ratio was determined by summing the respective observation values of 20 visual fields.

The impurity content of the $LaB_6$ sintered body can be represented by the oxygen content and the carbon content of the $LaB_6$ sintered body. The oxygen content is preferably less than 1.0 mass %, more preferably 0.5 mass % or less. On the other hand, the carbon content is preferably less than 0.1 mass %, more preferably 0.05 mass % or less.

The oxygen content and the carbon content based on the impurities are measured by the following methods, respectively. The sample of the $LaB_6$ sintered body is pulverized to obtain a measurement sample.

The oxygen content is measured by heating the measurement sample in a graphite crucible under an inert gas atmosphere, reacting oxygen decomposed or dissociated from the measurement sample with carbon and determining the generated carbon monoxide or carbon dioxide based on infrared ray absorbance. This is referred to as "inert gas fusion method."

On the other hand, the carbon content is measured by heating the measurement sample in a quartz tube furnace and then measuring the carbon component generated from the volatilized, decomposed, and combusted measurement sample and the like by using an infrared absorption method.

The impurities include one or two kinds or more selected from carbon alone, lanthanum carbide, boron carbide, lanthanum oxide, boron oxide, and lanthanum boron complex oxide.

To adjust the content of impurities other than nitrogen elements in the $LaB_6$ sintered body to 0.3 volume % or less, the high purification is preferably carried out to remove impurities from the $LaB_6$ raw powder, which is the raw material. The high purification will be explained in the below-mentioned description on the method of producing an $LaB_6$ sintered body of the present invention.

When nitrogen is solid-dispersed in the $LaB_6$ sintered body, lanthanum nitride in which lanthanum and nitrogen is solid-dispersed in an amorphous state may exist in addition to an interstitial solid solution in which nitrogen is intruded in the gap between the atoms of the $LaB_6$ crystal lattice. However, since this lanthanum nitride may relax the internal stress of an $LaB_6$ sputtering film, nitrogen and its compound is not taken into account as the impurities.

As described above, the $LaB_6$ sintered body should have nitrogen elements in 0.1 mass % or more and 3 mass % or less and impurities other than nitrogen elements in 0.3 volume % or less, in which the relative density is 88% or more. If this relative density is less than 88%, a target obtained by using the $LaB_6$ sintered body contains a large numbers of pores. Then, during sputtering, an organic content, water, and the like that are absorbed in the pores are discharged in a vacuum chamber to contaminate the chamber and then are incorporated in a sputtering film to cause degradation of the film.

The relative density indicates the actual density ratio to the theoretical density of an actual sintered body.

The method of producing an $LaB_6$ sintered body of the present invention will be explained below.

Method of Producing $LaB_6$ Sintered Body

The method of producing an $LaB_6$ sintered body of the present invention includes the steps of (a) heating $LaB_6$ powder at a temperature of 600° C. or more and 800° C. or less in the atmosphere, (b) carrying out acid treatment of the heated $LaB_6$ powder obtained in the step (a), and (c) sintering the acidized $LaB_6$ powder obtained in the step (b) on the condition of a temperature of 1800° C. or more and a pressure of 30 MPa or more under a nitrogen gas atmosphere, in which the oxygen content is adjusted to less than 1.0 mass % and in which the carbon content is adjusted to less than 0.1 mass % in the acidized $LaB_6$ powder obtained in the step (b).

In the method of producing an $LaB_6$ sintered body of the present invention, high purification is carried out for $LaB_6$ powder used as the raw material to adjust the content of impurities other than nitrogen elements in the obtained $LaB_6$ sintered body to 0.3 volume % or less.

High Purification of $LaB_6$ Raw Powder

In the production method of the present invention, the steps (a) and (b) are carried out as high purification. Details of these steps (a) and (b) are described below.

Step (a)

The step (a) in the high purification is to heat $LaB_6$ raw powder, which is the raw material, at a temperature of 600° C. or more and 800° C. or less in the atmosphere.

The $LaB_6$ raw powder may be synthesized material or may be a commercially available material. In the $LaB_6$ powder, impurities containing one or two kinds or more selected from carbon alone, lanthanum oxide, lanthanum carbide, boron oxide, lanthanum boron complex oxide, and boron carbide which are unavoidably incorporated during production. In the production method of the present invention, the $LaB_6$ raw powder is heated in the atmosphere to convert the lanthanum carbide and the boron carbide into the respective oxides. The lanthanum oxide, the boron oxide, and the lanthanum boron complex oxide can easily be removed in the next acid treatment step (b). The carbon alone is removed as carbon dioxide in the present step.

In the production method of the present invention, the temperature during oxidation is 600° C. or more and 800° C. or less in the atmosphere. The reason is because carbon alone, lanthanum carbide, and boron carbide are not oxidized enough at a temperature of less than 600° C. and because $LaB_6$ itself is oxidized at a temperature of more than 800° C., leading to the decreased yield of $LaB_6$ itself.

The mean particle size of $LaB_6$ powder to be used in the present step is preferably 0.1 μm or more and 20 μm or less, more preferably 0.5 μm or more and 10 μm or less, further more preferably 1 μm or more and 5 μm or less, from the viewpoint of sintering capability for the below-mentioned sintering step (c). When the mean particle size is 0.1 μm or more, oxygen and carbon are easily removed, and further the production cost is low. When the mean particle size is 20 μm or less, the surface energy to be the driving force for sintering is increased to easily obtain the sintered body with high density.

Step (b)

The step (b) in the high purification is to acidize the heated $LaB_6$ powder obtained in the step (a).

The inorganic acid for dissolving the impurity oxide in the step (b) can be selected from hydrochloric acid, sulfuric acid, and nitric acid. The type and the concentration of an inorganic acid to be used, and the temperature and the time of the acidization are preferably selected based on the component and the content of the oxide to be dissolved. The reason is because if the oxidizability of the inorganic acid is too high, not only the oxide but also $LaB_6$ itself are oxidized and dissolved, leading to the decreased yield of $LaB_6$ itself and because if the dissolving ability of an inorganic acid is low, it takes a time to dissolve the oxide, or the oxide is not dissolved enough in some cases so that the oxide cannot be removed enough. The inorganic acid includes phosphoric acid and hydrofluoric acid. However, the phosphoric acid has a low dissolving ability while the hydrofluoric acid has a high dissolving ability, which dissolves $LaB_6$ itself and has toxicity and hazard. Thus, these inorganic acids are not suitable. On the other hand, an organic acid is not suitable due to the low dissolving ability.

Due to their high oxidizability, nitric acid and sulfuric acid are likely to oxidize and dissolve $LaB_6$ itself, so that the acidization condition should be strictly selected and controlled. Thus, these acids should be used carefully. On the other hand, due to its little oxidizability, hydrochloric acid is unlikely to oxidize and dissolve $LaB_6$ itself and thus preferably used.

For example, when hydrochloric acid is used, the concentration is preferably 1 $mol/dm^3$ or more and 6 $mol/dm^3$ or less. The reason is because if the concentration is less than 1 $mol/dm^3$, it takes a time to dissolve impurities due to the low dissolution rate and because if the concentration exceeds 6 $mol/dm^3$, $LaB_6$ itself is easily oxidized. The concentration is more preferably 2 $mol/dm^3$ or more and 6 $mol/dm^3$ or less, particularly preferably 4 $mol/dm^3$ or more and 6 $mol/dm^3$ or less.

This acidization may be carried out at a normal temperature but is preferably carried out on heating. The heating temperature is preferably 40° C. or more and 80° C. or less. The reason is because if the heating temperature is less than 40° C., it takes a time to dissolve impurities and because if the heating temperature exceeds 80° C., $LaB_6$ itself is easily oxidized.

The acidized powder is preferably dried, particularly vacuum-dried to remove the contained water after the acid component is removed with pure water or ion-exchanged water. The powder is vacuum-dried to avoid water from reacting with $LaB_6$ to generate impurity oxide when water evaporates.

Thus, after high purification (the steps (a) and (b)) of the $LaB_6$ raw powder, the oxygen content of the acidized $LaB_6$ powder is adjusted to preferably less than 1.0 mass %, more preferably less than 0.5 mass %, and the carbon content is adjusted to preferably less than 0.1 mass %, more preferably less than 0.05 mass %.

Step (b')

Between the step (b) and the below-mentioned step (c), the step (b') may be provided, in which the highly purified $LaB_6$ powder (acidized $LaB_6$ powder) obtained from the steps (a) and (b) is mixed with $LaB_6$ microscopic powder with a mean particle size smaller than the highly purified $LaB_6$ powder to obtain mixed powder.

In the description on this step (b'), the highly purified $LaB_6$ powder is sometimes referred to as the $LaB_6$ powder N while the $LaB_6$ microscopic powder is referred to as the $LaB_6$ microscopic powder S.

Two kinds of lanthanum hexaboride powders with different mean particle sizes are mixed in this way and the mixed powder is molded and sintered in the below-mentioned step (c), so as to produce the lanthanum hexaboride sintered body with high purity and high density.

$LaB_6$ Powder N

For the use in this step (b'), the mean particle size of the $LaB_6$ powder N is preferably 1 μm or more and 5 μm or less so as to be larger than that of the $LaB_6$ microscopic powder S. The mean particle size of this $LaB_6$ powder N is preferably 1 μm or more and 4 μm or less, more preferably 1 μm or more and 3 μm or less.

Since the particle size of the highly purified $LaB_6$ raw powder is reduced by only a few percent after the high purification, no substantial differences are caused in the mean particle size of the $LaB_6$ powder N even if the mean particle size of the $LaB_6$ raw powder is defined as the above-mentioned range instead of the mean particle size of the $LaB_6$ powder N.

$LaB_6$ Microscopic Powder S

Since the mean particle size of the $LaB_6$ microscopic powder S is smaller than that of the $LaB_6$ powder N, the $LaB_6$ microscopic powder S has a large surface area, causing a high surface energy contributed to driving power for sintering. Thus, the $LaB_6$ microscopic powder S itself has excellent sintering capability. However, due to the small particle size, the particles non-uniformly form aggregates by van der Waals force, causing the poor fillability of the particles. As a result, the contact of the particles each other is insufficient to cause a problem in which sintering reaction is not started easily. The inventors have found that the particles are sufficiently contacted with each other by adding the $LaB_6$ microscopic powder S of appropriate quantities in the $LaB_6$ powder N with a larger mean particle size and a superior fillability than those of this $LaB_6$ microscopic powder S, causing the high surface energy of the $LaB_6$ microscopic powder S to provide excellent sintering capability.

The $LaB_6$ microscopic powder S has preferably a mean particle size of 50 nm or more and 500 nm or less. If this mean particle size is less than 50 nm, the mass production is difficult, which is not economical. If this mean particle size is more than 500 nm, the effect on improving the relative density of the lanthanum hexaboride sintered body is not confirmed. This mean particle size is more preferably 50 nm or more and 300 nm or less, further more preferably 60 nm or more and 200 nm or less.

The method of producing the $LaB_6$ microscopic powder S is not limited. Accordingly, the commercially available $LaB_6$ powder may be pulverized with a jet mill, a bead mill, or the like.

Alternatively, the $LaB_6$ microscopic powder S may be synthesized by thermal reduction of a lanthanum compound and boron carbide under the reductive atmosphere, by thermal plasma, or by a hydrothermal method after the addition of a reducing agent. Then, this obtained powder may be pulverized with a jet mill, a bead mill, or the like to adjust a predetermined particle size.

A preferable method of producing the $LaB_6$ microscopic powder S includes carrying out thermal-reduction of a lanthanum-containing compound and a boron-containing compound at a temperature of 1200° C. or more and 1500° C. or less in vacuum or under an inert gas atmosphere and then decreasing impurities in the obtained product containing lanthanum hexaboride.

The decreasing of impurities can be carried out in different ways including, but not limited to, acid cleaning with the mixture of an inorganic acid and water. The inorganic acid used for acid cleaning is preferably hydrochloric acid to suppress oxidation of the obtained lanthanum hexaboride. The product obtained by thermal reduction contains not only lanthanum hexaboride but also a large amount of impurities derived from the raw material. For example, the decreasing of impurities by acid cleaning can adjust the carbon content of the product to 2.0 mass % or less and adjust the oxygen content to 3.0 mass % or less.

Furthermore, the same high purification as that for obtaining the $LaB_6$ powder N, specifically, the heating of the step (a) and the acidization of the step (b) are carried out to adjust the impurity content to the same level as that of a commercially available material, more preferably to adjust the carbon content to 0.5 mass % or less and adjust the oxygen content to 1.0 mass % or less, further more preferably to adjust the impurity content to the same level as that of the $LaB_6$ powder N.

The mean particle sizes of the $LaB_6$ powder N and the $LaB_6$ microscopic powder S are measured by SEM. The carbon content and the oxygen content are measured by the above-mentioned infrared absorption method and an inert gas fusion method.

Method of Mixing $LaB_6$ Powder N with $LaB_6$ Microscopic Powder S and the Mixture Fraction In the production method of the present invention, the $LaB_6$ powder N of a mass $M_H$ is mixed with the $LaB_6$ microscopic powder S of a mass Ms in preferably a mass ratio $(M_N/Ms)$ of from 97/3 to 70/30, more preferably from 96/4 to 90/10. If the $LaB_6$ microscopic powder S is contained in less than 3 mass % based on the total amount of the $LaB_6$ powder N and the $LaB_6$ microscopic powder S, the amount of the $LaB_6$ microscopic powder S is insufficient for the contribution of the high surface energy of the $LaB_6$ microscopic powder S, so that effect may not be produced on the improvement of the relative density. If the content of the $LaB_6$ microscopic powder S is more than 30 mass %, the fillability is decreased due to the influence of the aggregation of the $LaB_6$ microscopic powder S, so that the sintering reaction may hardly occur. Furthermore, even if the aggregation is avoided by some methods, containing the $LaB_6$ microscopic powder S in more than 30 mass % is not practicable in respect of the production cost of the $LaB_6$ microscopic powder S. The $LaB_6$ microscopic powder S has a large surface area as well as a large amount of oxygen derived from the surface oxide layer. Thus, if the $LaB_6$ microscopic powder S is added too much, oxygen contained in the sintering body is increased, so that the performance of the sputtering film may be degraded when the sintering body is used as target material.

The mixing method can be carried out in different ways, including, but not limited to, slurrying the $LaB_6$ powder N and the $LaB_6$ microscopic powder S in an organic solvent and then mixing this slurried powder with a ball mill. Any binder may be added before the $LaB_6$ powder N and the $LaB_6$ microscopic powder S are slurried in an organic solvent and then these slurried powders are mixed with a ball mill or the like.

The mixed powder is preferably dried under a reduced pressure or under an inert gas atmosphere. In addition, the mixed powder may be dried by spray drying or the like and then granulated into granulated powder Step (c)

In this step (c), the acidized $LaB_6$ powder obtained in the step (b) or the mixed powder of the $LaB_6$ powder N and the $LaB_6$ microscopic powder S obtained in the step (b') is sintered under the condition of an temperature of 1800° C. or more, a pressure of 30 MPa or more under a nitrogen gas atmosphere to obtain the dense $LaB_6$ sintered body, in the lattices of which nitrogen elements are solid-dispersed.

In this sintering step, the highly purified $LaB_6$ powder itself may be molded and then sintered or may be added in a solvent with any binder, slurried, granulated, and then molded and defatted.

Generally, the $LaB_6$ powder has sintering resistance, but the highly purified $LaB_6$ powder is pressed and sintered at a temperature of 1800° C. or more and at a press pressure of 30 MPa or more in the nitrogen gas to obtain the $LaB_6$ sintered body containing nitrogen in 0.1 mass % or more and 3 mass % or less and impurities other than nitrogen in 0.3 volume % or less, in which the relative density is 88% or more.

The pressure sintering is appropriately carried out by using a hot press device. The obtained $LaB_6$ powder is filled in the black lead mold in a hot press device to press and sinter at a temperature of 1800° C. or more and 1950° C. or less and at a press pressure of 30 MPa or more and 40 MPa or less in the nitrogen gas. As a result, the sintered body can be obtained, containing impurities in 0.3 volume % or less and nitrogen in 0.1 mass % or more and 3 mass % or less, in which the relative density is 88% or more.

The temperature of less than 1800° C. is insufficient for the densification, so that the sintered body with a relative density of 88% or more cannot be obtained even if the pressure is increased. The temperature of more than 1950° C. may decrease the relative density.

The press pressure of less than 30 MPa does not lead to the sufficient densification so that the sintered body with a relative density of 88% or more cannot be obtained. The press pressure should be higher, but the withstanding pressure of a sintering jig used for a typical hot pressing sintering is 40 MPa. This means that very few jigs with a further higher withstanding pressure exist, and thus the press pressure is expected to be at most 40 MPa.

Another method of solid-dispersing nitrogen includes heating $LaB_6$ powder in nitrogen before sintering. This heating temperature should be 1000° C. or more. If the heating temperature is increased to solid-disperse nitrogen sufficiently, the sintering activity is decreased by grain growth, so that pulverization should be repeated. In this case, oxidation by pulverization cannot avoid impurities from being contained in $LaB_6$ powder. Thus, as a method of solid-dispersing nitrogen, sintering is preferably carried out under a nitrogen atmosphere.

If conditions are right, another sintering method such as hot isostatic press (hereinafter referred to as "HIP") may be used.

These methods of producing an $LaB_6$ sintered body of the present invention effectively produces an $LaB_6$ sintered body with high purity and high density, which is suitable as a sputtering target and the like for manufacturing an $LaB_6$ film with excellent crystallinity and good work function.

Target and $LaB_6$ Sputtering Film

The present invention also provides a target formed of the $LaB_6$ sintered body of the present invention with the above-mentioned properties and an $LaB_6$ sputtering film formed by sputtering this target.

The $LaB_6$ sputtering film with higher purity and superior crystallinity than those of a conventional $LaB_6$ target can be obtained by sputtering a target formed of using $LaB_6$ in which the impurity content is low and the nitrogen content is appropriately controlled.

In other words, to form an $LaB_6$ sputtering film with excellent crystallinity and high purity, the $LaB_6$ sintered body is used as a target, containing nitrogen in 0.1 mass % or more and 3 mass % or less and impurities other than nitrogen in 0.3 volume % or less, in which the relative density is 88% or more. This $LaB_6$ sintered body contains oxygen in preferably less than 1.0 mass %, more preferably 0.5 mass % or less and carbon in preferably less than 0.1 mass %, more preferably 0.05 mass % or less, based on impurities.

The $LaB_6$ sputtering film with high purity and excellent crystallinity obtained in this way has low work function. The work function of this sputtering film is preferably 3.1 eV or less, more preferably 2.8 eV or less, further more preferably 2.7 eV or less.

The method of measuring the work function includes photoelectron spectroscopy such as ultraviolet photoelectron spectroscopy (hereinafter referred to as "UPS") or X-ray photoelectron spectroscopy (hereinafter referred to as "XPS"), and the Kelvin probe method. The photoelectron spectroscopy has high measurement accuracy but high price and high measurement cost. On the other hand, the Kelvin probe method has low price and low measurement cost but rather inferior measurement accuracy. Therefore, the present invention adopts the work function measured by UPS and uses the work function measured by the Kelvin probe method as reference.

A sputterer generally includes a dipole DC glow discharge sputterer, a magnetron sputterer, and an ion-beam sputterer, and the like. The target formed of the $LaB_6$ sintered body of the present invention can be applied to any sputterers.

The atmosphere during sputtering is an inert gas atmosphere such as an Ar gas atmosphere or the like.

The material of an object (e.g. substrate) on which an $LaB_6$ sputtering film is formed includes, but limited to, metals such as tungsten and copper, glass, an Si wafer, a synthetic resin such as a polyamide resin. The temperature during sputtering is preferably 0° C. or more and 300° C. or less. The $LaB_6$ sputtering film with superior crystallinity is obtained at a higher temperature during sputtering. However, if the temperature is 300° C. or more, the thermal stress may be in excess when the $LaB_6$ sputtering film is cooled to room temperature after formed. Furthermore, in this case, it takes a time until the temperature of the substrate becomes uniform after the substrate is introduced in a sputtering chamber, resulting in poor productivity.

The upper limit of the sputtering temperature is determined based on a film-formed substrate. When sputtering is carried out on a substrate with heat resistance, such as a metal and an Si wafer, the problem of the sputtering temperature does not arise. However, when sputtering is carried out on a resin substrate, the sputtering temperature should be the heatproof temperature of the resin or less. Therefore, for more general application, the sputtering temperature is preferably 100° C. or less.

On the other hand, if the temperature during sputtering is 0° C. or less, a refrigerant other than water is unpreferably needed to cool the temperature in a sputtering chamber. The temperature during sputtering is preferably 0° C. or more and 300° C. or less, more preferably 0° C. or more and 100° C. or less.

EXAMPLES

The present invention will be explained in more detail with reference to Examples below, but not limited to thereto.

Various properties in each Example were measured according to the following method.

The mean particle size of each powder was measured by an SEM (S-4000) available from Hitachi, Ltd. The largest diameters of 300-500 particles from each powder are determined, and then the average largest diameter is determined as the mean particle size of each powder.

Highly Purified $LaB_6$ Powder (1) Measurement of Oxygen Content and Carbon Content The oxygen content is determined by measuring the oxygen content of the sample powder of 50 mg by the inert gas fusion method with a simultaneous oxygen nitrogen analyzer (TC-436) available from LECO Corporation.

The carbon content is determined by measuring the carbon content of the sample powder of 100 mg by the infrared absorption method with a carbon analyzer (WC-200) available from LECO Corporation.

$LaB_6$ Microscopic Powder (2) Measurement of Oxygen Content and Carbon Content

The oxygen content and the carbon content were determined by the same method as that for highly purified $LaB_6$ powder.

Sintered Body of $LaB_6$ Powder (3) Oxygen Content and Carbon Content

After the sample of the sintering body was pulverized, the oxygen content and the carbon content were measured in the same way for the $LaB_6$ powder.

(4) Impurity Content

The sample of the pulverized sintered body sample was observed under an SEM (5-4000) available from Hitachi, Ltd to determine the impurity content based on the area ratio of the impurity phase in the visual field. The size of one visual field is 720 μm×940 μm. The area ratio was determined by summing the respective observation values of 20 visual fields.

(5) Identification of Impurity Species

For the impurity phase in the SEM visual field, elementary analysis was carried out with an electron probe microanalyser (herein referred to as "EPMA") (JXA-8800) available from JEOL Ltd.

(6) Relative Density

The weights of the sample of sintered body in air and in water were measured with a commercially available electronic balance to calculate the density from the obtained buoyancy by the so-called Archimedes's method to determine the density ratio (relative density) to theoretical density.

(7) The Content of Nitrogen Element

The nitrogen content is determined by measuring the nitrogen content of the sample powder of 50 mg by the thermal conductivity technique with a simultaneous oxygen nitrogen analyzer (TC-436) available from LECO Corporation.

(8) Determination of Nitrogen Elements Solid-Dispersed in the Lattices of $LaB_6$ Sintered Body The lattice constant was calculated from the (400), (410), (411), (331), (420), (421) peaks of $LaB_6$ with an X-ray diffractometer (PANalytical X'Pert PRO) available from Spectris Co., Ltd. and then compared with the theory value to determine that nitrogen elements were solid-dispersed in the lattices of the $LaB_6$ sintered body.

$LaB_6$ Sputtering Film (9) Measurement of Work Function by Vacuum UPS Method

The work function of the $LaB_6$ sputtering film was measured at a pressure of $1.33 \times 10^{-6}$ Pa with an ultraviolet photoelectron spectrometer (MUL-010HI) available from Physical Electronics, Inc.

(10) Measurement of Work Function by Kelvin Probe Method

The work function of the $LaB_6$ sputtering film was measured in the atmosphere with a scanning Kelvin probe (SKP5050) available from KP technology.

(11) Thin Film XRD Measurement

X-ray diffraction measurement was carried out with a thin film X-ray diffractometer (PW3040/00) available from Philips Electronics Japan, Ltd. The CuKα ray (wavelength λ: 0.154 nm) is used as the X-ray source. The measured angle (2θ) was set to 20-100 degrees. From the obtained result, the peak intensity of each sputtering film was compared with respect to the peak of the crystal face with the highest intensity.

Example 1

(1) High Purification for Commercially Available $LaB_6$ Raw Powder

A commercially available $LaB_6$ powder was oxidized at 700° C. in the atmosphere and then acidized at 60° C. in hydrochloric acid of 6 mol/dm³. The acidized powder was cleaned with ion-exchanged water until the pH of the filtrate was 6 or more and until the chloride ion concentration was 1 mg/dm³ or less, and then vacuum-dried at 110° C. The obtained $LaB_6$ powder contained oxygen in 0.38 mass % and carbon in 0.006 mass %, based on impurities. The mean particle size of the obtained $LaB_6$ powder was 1.5 μm.

(2) Production of $LaB_6$ Sintered Body

The powder highly purified in the above-mentioned (1) was sintered with a hot press device at a temperature of 1950° C. and at a press pressure of 40 MPa in nitrogen gas for 2 hours. The obtained sintered body contained nitrogen elements in 0.44 mass % and impurities other than nitrogen, which consisted of amorphous boron carbide and amorphous lanthanum boron complex oxide, in 0.006 volume %, in which the relative density is 92.4%. The impurities contained carbon in 0.011 mass % and oxygen in 0.21 mass %. The lattice constant of the obtained $LaB_6$ sintered body was 4.1578 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 0.5 Pa and at a temperature of 20° C. in Ar gas with a magnetron sputterer by using the $LaB_6$ sintered body obtained in the above-mentioned (2) as a target. The obtained $LaB_6$ film contained very little impurities other than nitrogen. The peak intensity according to the thin film XRD measurement was about 2.5 times higher than that of the sputtering film formed by using the $LaB_6$ sintered body used as a target in Comparative Example 1 described below, in which nitrogen elements were not solid-dispersed, exhibiting high crystallinity. The work function was 3.6 eV according to the Kelvin probe method.

The condition and the result are shown in Table 1.

Example 2

(1) High Purification for Commercially Available $LaB_6$ Raw Powder

This was carried out in the same way as (1) of Example 1.

(2) Production of $LaB_6$ Sintered Body

The powder highly purified in the above-mentioned (1) was sintered with a hot press device at a temperature of 1950° C. and at a press pressure of 30 MPa in nitrogen gas for 2 hours. The obtained sintered body contained nitrogen elements in 0.42 mass % and impurities other than nitrogen, which consisted of amorphous boron carbide and amorphous lanthanum boron complex oxide, in 0.008 volume %, in which the relative density is 91.5%. The impurities contained carbon in 0.015 mass % and oxygen in 0.25 mass %. The lattice constant of the obtained $LaB_6$ sintered body was 4.1576 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 0.5 Pa and at a temperature of 20° C. in Ar gas with a magnetron sputterer by using the $LaB_6$ sintered body obtained in the above-mentioned (2) as a target. The obtained $LaB_6$ film contained very little impurities other than nitrogen. The peak intensity according to the thin film XRD measurement was about 2.0 times higher than that of the sputtering film formed by using the $LaB_6$ sintered body used as a target in Comparative Example 1 described below, in which nitrogen elements were not solid-dispersed, exhibiting high crystallinity. The work function was 3.6 eV according to the Kelvin probe method and 2.6 eV according to the vacuum UPS method, which were lower than that of Comparative Example 1. The condition and the result are shown in Table 1.

Example 3

(1) High Purification for Commercially Available $LaB_6$ Raw Powder

This was carried out in the same way as (1) of Example 1.

(2) Production of $LaB_6$ Sintered Body

The powder highly purified in the above-mentioned (1) was sintered with a hot press device at a temperature of 1950° C. and at a press pressure of 40 MPa in nitrogen gas for 3 hours. The obtained sintered body contained nitrogen elements in 0.99 mass % and impurities other than nitrogen elements, which consisted of amorphous boron carbide and amorphous lanthanum boron complex oxide, in 0.005 volume %, in which the relative density is 91.7%. The impurities contained carbon in 0.018 mass % and oxygen in 0.18 mass %. The lattice constant of the obtained $LaB_6$ sintered body was 4.1581 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 0.5 Pa and at a temperature of 20° C. in Ar gas with a magnetron sputterer by using the $LaB_6$ sintered body obtained in the above-mentioned (2) as a target. The obtained $LaB_6$ film contained very little impurities other than nitrogen. The peak intensity according to the thin film XRD measurement was about 1.7 times higher than that of the sputtering film formed by using the $LaB_6$ sintered body used as a target in Comparative Example 1 described below, in which nitrogen elements were not solid-dispersed, exhibiting high crystallinity. The work function was 3.7 eV according to the Kelvin probe method. The condition and the result are shown in Table 1.

Example 4

(1) High Purification for Commercially Available $LaB_6$ Raw Powder

This was carried out in the same way as (1) of Example 1.

(2) Production of $LaB_6$ Sintered Body

The powder highly purified in the above-mentioned (1) was sintered with a hot press device at a temperature of 1950° C. and at a press pressure of 40 MPa in nitrogen gas for 6 hours. The obtained sintered body contained nitrogen elements in 2.9 mass % and impurities other than nitrogen, which consisted of amorphous boron carbide and amorphous lanthanum boron complex oxide, in 0.01 volume %, in which the relative density is 89.5%. The impurities contained carbon in 0.038 mass % and oxygen in 0.17 mass %. The lattice constant of the obtained $LaB_6$ sintered body was 4.1736 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 0.5 Pa and at a temperature of 20° C. in Ar gas with a magnetron sputterer by using the $LaB_6$ sintered body obtained in the above-mentioned (2) as a target. The obtained $LaB_6$ film contained very little impurities other than nitrogen. The peak intensity according to the thin film XRD measurement was about 1.5 times higher than that of the sputtering film formed by using the $LaB_6$ sintered body used as a target in Comparative Example 1 described below, in which nitrogen elements were not solid-dispersed, exhibiting high crystallinity. The work function was 3.7 eV according to the Kelvin probe method. The condition and the result are shown in Table 1.

Example 5

(1) High Purification for Commercially Available $LaB_6$ Raw Powder

This was carried out in the same way as (1) of Example 1.

(2) Production of $LaB_6$ Sintered Body

The powder highly purified in the above-mentioned (1) was sintered with a hot press device at a temperature of 1800° C. and at a press pressure of 40 MPa in nitrogen gas for 2 hours. The obtained sintered body contained nitrogen elements in 0.28 mass % and impurities other than nitrogen, which consisted of amorphous boron carbide and amorphous lanthanum boron complex oxide, in 0.005 volume %, in which the relative density is 90.8%. The impurities contained carbon in 0.013 mass % and oxygen in 0.27 mass %. The lattice constant of the obtained $LaB_6$ sintered body was 4.1574 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 6.7 Pa in Ar gas with a magnetron sputterer by using the $LaB_6$ sintered body obtained in the above-mentioned (2) as a target. The obtained $LaB_6$ film contained very little impurities other than nitrogen elements. The peak intensity according to the thin film XRD measurement was about 2.0 times higher than that of the sputtering film formed by using the $LaB_6$ sintered body used as a target in Comparative Example 1 described below, in which nitrogen elements were not solid-dispersed, exhibiting high crystallinity. The work function was 3.6 eV according to the Kelvin probe method. The condition and the result are shown in Table 1.

Example 6

(1) High Purification for Commercially Available $LaB_6$ Raw Powder

This was carried out in the same way as (1) of Example 1.

(2) Production of $LaB_6$ Sintered Body

The powder highly purified in the above-mentioned (1) was sintered with a hot press device at a temperature of 1800° C. and at a press pressure of 30 MPa in nitrogen gas for 2 hours. The obtained sintered body contained nitrogen elements in 0.15 mass % and impurities other than nitrogen elements, which consisted of amorphous boron carbide and amorphous lanthanum boron complex oxide, in 0.009 volume %, in which the relative density is 89.6%. The impurities contained carbon in 0.015 mass % and oxygen in 0.28 mass %. The lattice constant of the obtained $LaB_6$ sintered body was 4.1573 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 6.7 Pa in Ar gas with a magnetron sputterer by using the $LaB_6$ sintered body obtained in the above-mentioned (2) as a target. The obtained $LaB_6$ film contained very little impurities other than nitrogen elements. The peak intensity according to the thin film XRD measurement was about 1.5 times higher than that of the sputtering film formed by using the $LaB_6$ sintered body used as a target in Comparative Example 1 described below, in which nitrogen elements were not solid-dispersed, exhibiting high crystallinity. The work function was 3.7 eV according to the Kelvin probe method and 3.0 eV according to the vacuum UPS method, which were lower than that of Comparative Example 1. The condition and the result are shown in Table 1.

Example 7

(1) High Purification for Commercially Available $LaB_6$ Raw Powder

This was carried out in the same way as (1) of Example 1.

(2) Production of $LaB_6$ Sintered Body

The $LaB_6$ microscopic powder of 5 mass % (mean particle size: 100 nm, oxygen content: 0.7 mass %, carbon content: 0.1 mass %) was added in the powder highly purified in the above-mentioned (1) with a mean particle size of 1.5 μm and then were sintered with a hot press device at a temperature of 1800° C. and at a press pressure of 30 MPa in nitrogen gas for 2 hours. The obtained sintered body contained nitrogen elements in 0.33 mass % and impurities other than nitrogen elements, which consisted of amorphous boron carbide and amorphous lanthanum boron complex oxide, in 0.007 volume %, in which the relative density is 94.3%. The impurities contained carbon in 0.024 mass % and oxygen in 0.20 mass %. The lattice constant of the obtained $LaB_6$ sintered body was 4.1576 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 0.5 Pa and at a temperature of 20° C. in Ar gas with a magnetron sputterer by using the $LaB_6$ sintered body obtained in the above-mentioned (2) as a target. The obtained $LaB_6$ film contained very little impurities other than nitrogen elements. The peak intensity according to the thin film XRD measurement was about 2.6 times higher than that of the sputtering film formed by using the $LaB_6$ sintered body used as a target in Comparative Example 1 described below, in which nitrogen elements were not solid-dispersed, exhibiting high crystallinity. The work function was 3.5 eV based on evaluation by the Kelvin probe method. The condition and the result are shown in Table 1.

Example 8

(1) High Purification for Commercially Available $LaB_6$ Raw Powder

This was carried out in the same way as (1) of Example 1.

(2) Production of $LaB_6$ Sintered Body

The same $LaB_6$ microscopic powder as those of Example 7 of 5 mass % was added in the powder highly purified in the above-mentioned (1) with a mean particle size of 1.5 μm and then were sintered with a hot press device at a temperature of 1950° C. and at a press pressure of 30 MPa in nitrogen gas for 2 hours. The obtained sintered body contained nitrogen elements in 0.40 mass % and impurities other than nitrogen elements, which consisted of amorphous boron carbide and amorphous lanthanum boron complex oxide, in 0.011 volume %, in which the relative density is 96.1%. The impurities contained carbon in 0.031 mass % and oxygen in 0.15 mass %. The lattice constant of the obtained $LaB_6$ sintered body was 4.1577 Å, which was larger than the theoretical value. Therefore, it was determined that nitrogen elements were solid-dispersed in the lattices of the $LaB_6$ sintered body.

(3) Sputtering Film Formed by Using $LaB_6$ Sintered Body as Target

The sputtering film was formed at a pressure of 0.5 Pa and at a temperature of 20° C. in Ar gas with a magnetron sputterer by using the $LaB_6$ sintered body obtained in the above-mentioned (2) as a target. The obtained $LaB_6$ film contained very little impurities other than nitrogen elements. The peak intensity according to the thin film XRD measurement was about 2.8 times higher than that of the sputtering film formed by using the $LaB_6$ sintered body used as a target in Comparative Example 1 described below, in which nitrogen elements were not solid-dispersed, exhibiting high crystallinity. The work function was 3.45 eV according to the Kelvin probe method and 2.4 eV according to the vacuum UPS method, which were lower than that of Comparative Example 1. The condition and the result are shown in Table 1.

Comparative Example 1

(1) High Purification for Commercially Available $LaB_6$ Raw Powder

This was carried out in the same way as (1) of Example 1.

(2) Production of $LaB_6$ Sintered Body

The powder highly purified in the above-mentioned (1) was sintered with a hot press device at a temperature of 1950° C. and at a press pressure of 40 MPa in argon gas for 2 hours. The obtained sintered body contained nitrogen elements in 0.006 mass % and impurities other than nitrogen elements, which consisted of amorphous boron carbide and amorphous lanthanum boron complex oxide, in 0.005 volume %, in which the relative density is 89.5%. The impurities contained carbon in 0.015 mass % and oxygen in 0.31 mass %. The lattice constant of the obtained $LaB_6$ sintered body was 4.1567 Å, which was rarely different from the theoretical value. Therefore, it was determined that very few nitrogen elements are solid-dispersed in the lattices of the $LaB_6$ sintered body.

(3) Sputtering Film Formed by Using LaB$_6$ Sintered Body as Target

The sputtering film was formed at a pressure of 0.5 Pa and at a temperature of 20° C. in Ar gas with a magnetron sputterer by using the LaB$_6$ sintered body obtained in the above-mentioned (2) as a target. The obtained LaB$_6$ film contained very little impurities other than nitrogen elements. The peak intensity of LaB$_6$ according to the thin film XRD measurement was about 40% of that of the sputtering film formed by using the LaB$_6$ sintered body used as a target in Example 1, in which nitrogen elements were solid-dispersed, exhibiting low crystallinity. The work function was 3.9 eV according to the Kelvin probe method and 3.7 eV according to the vacuum UPS method. The condition and the result are shown in Table 1.

Comparative Example 2

(1) Production of LaB$_6$ Sintered Body by Using Commercially Available LaB$_6$ Powder A commercially available LaB$_6$ powder was sintered with a hot press device at a temperature of 1950° C. and at a press pressure of 40 MPa in nitrogen gas for 2 hours. The obtained sintered body contained nitrogen elements in 0.45 mass % and impurities other than nitrogen elements, which consisted of amorphous boron carbide and amorphous lanthanum boron complex oxide, in 0.9 volume %, in which the relative density is 91.5%. The impurities contained carbon in 0.3 mass % and oxygen in 1.8 mass %. The lattice constant of the obtained LaB$_6$ sintered body was 4.1576 Å, which was larger than the theoretical value. Therefore, it was determined that nitrogen elements were solid-dispersed in the lattices of the LaB$_6$ sintered body.

(2) Sputtering Film Formed By Using LaB$_6$ Sintered Body as Target

The sputtering film was formed at a pressure of 6.7 Pa in Ar gas with a magnetron sputterer by using the LaB$_6$ sintered body obtained in the above-mentioned (1) as a target. The obtained LaB$_6$ film has a peak intensity of LaB$_6$ equivalent to that of the sputtering film formed by using the LaB$_6$ sintered body produced by sintering the highly purified powder in nitrogen gas in Example 1, according to the thin film XRD measurement. However, the obtained LaB$_6$ film contained a large amount of impurities with a crystal structure other than that of LaB$_6$. The work function was 3.8 eV according to the Kelvin probe method and 3.2 eV according to the vacuum UPS method. The condition and the result are shown in Table 1.

Comparative Example 3

(1) High Purification for Commercially Available LaB$_6$ Raw Powder

This was carried out in the same way as (1) of Example 1.

(2) Production of LaB$_6$ Sintered Body

The powder highly purified in the above-mentioned (1) was sintered with a hot press device at a temperature of 1800° C. and at a press pressure of 20 MPa in nitrogen gas for 2 hours. The obtained sintered body contained nitrogen elements in 0.10 mass % and impurities other than nitrogen elements, which consisted of amorphous boron carbide and amorphous lanthanum boron complex oxide, in 0.08 volume %, in which the relative density is 86.5%. The impurities contained carbon in 0.020 mass % and oxygen in 0.33 mass %. The lattice constant of the obtained LaB$_6$ sintered body was 4.1571 Å, which was larger than the theoretical value. Therefore, it was determined that a small amount of nitrogen elements were solid-dispersed in the lattices of the LaB$_6$ sintered body.

(3) Sputtering Film Formed by Using LaB$_6$ Sintered Body as Target

The sputtering film was formed at a pressure of 0.5 Pa and at a temperature of 20° C. in Ar gas with a magnetron sputterer by using the LaB$_6$ sintered body obtained in the above-mentioned (2) as a target. The obtained LaB$_6$ film contained very little impurities other than nitrogen elements. The peak intensity of LaB$_6$ according to the thin film XRD measurement was about 20% of that of the sputtering film formed by using the LaB$_6$ sintered body used as a target in Example 1 described below, in which nitrogen elements were solid-dispersed in an amount falling within an appropriate rage, exhibiting low crystallinity. The work function was 4.8 eV according to the Kelvin probe method and 4.2 eV according to the vacuum UPS method. The condition and the result are shown in Table 1.

Comparative Example 4

(1) High Purification for Commercially Available LaB$_6$ Raw Powder

This was carried out in the same way as (1) of Example 1.

(2) Production of LaB$_6$ Sintered Body

The powder highly purified in the above-mentioned (1) was sintered with a hot press device at a temperature of 1950° C. and at a press pressure of 20 MPa in nitrogen gas for 6 hours. The obtained sintered body contained nitrogen elements in 3.5 mass % and impurities other than nitrogen elements, which consisted of amorphous boron carbide and amorphous lanthanum boron complex oxide, in 0.2 volume %, in which the relative density is 87.5%. The impurities contained carbon in 0.042 mass % and oxygen in 0.11 mass %. The lattice constant of the obtained LaB$_6$ sintered body was 4.1759 Å, which was larger than the theoretical value. Therefore, it was determined that nitrogen elements were solid-dispersed in the lattices of the LaB$_6$ sintered body.

(3) Sputtering Film Formed by Using LaB$_6$ Sintered Body as Target

The sputtering film was formed at a pressure of 0.5 Pa and at a temperature of 20° C. in Ar gas with a magnetron sputterer by using the LaB$_6$ sintered body obtained in the above-mentioned (2) as a target. The obtained LaB$_6$ film contained very little impurities other than nitrogen elements. The peak intensity of LaB$_6$ according to the thin film XRD measurement was about 90% of that of the sputtering film formed by using the LaB$_6$ sintered body used as a target in Comparative Example 1, exhibiting low crystallinity. The work function was 4.0 eV according to the Kelvin probe method. The condition and the result are shown in Table 1.

TABLE 1

| | | Sintering condition (Hot press device is used) | | | | Aspect of LaB$_6$ sintered body | | | | | | Sputtering film formed by using LaB$_6$ sintered body as target | Work function | |
|---|---|---|---|---|---|---|---|---|---|---|---|---|---|---|
| | | Atmosphere gas | Sintering temperature (°C.) | Sintering pressure (MPa) | Sintering time (hr) | Nitrogen content (mass %) | Impurity content (volume %) | Carbon content (mass %) | Oxygen content (mass %) | Relative density (%) | Lattice constant (Å) | Peak intensity ratio according to thin film XRD measurement | Vacuum UPS method (eV) | Kelvin probe method (eV) |
| Examples | 1 | Nitrogen | 1950 | 40 | 2 | 0.44 | 0.006 | 0.011 | 0.21 | 92.4 | 4.1578 | About 2.5 times higher than sputtering film of Comparative Example 1 | — | 3.6 |
| | 2 | Nitrogen | 1950 | 30 | 2 | 0.42 | 0.008 | 0.015 | 0.25 | 91.5 | 4.1576 | About 2.0 times higher than sputtering film of Comparative Example 1 | 2.6 | 3.6 |
| | 3 | Nitrogen | 1950 | 40 | 3 | 0.99 | 0.005 | 0.018 | 0.18 | 91.7 | 4.1581 | About 1.7 times higher than sputtering film of Comparative Example 1 | — | 3.7 |
| | 4 | Nitrogen | 1950 | 40 | 6 | 2.9 | 0.01 | 0.038 | 0.17 | 89.5 | 4.1736 | About 1.5 times higher than sputtering film of Comparative Example 1 | — | 3.7 |
| | 5 | Nitrogen | 1800 | 40 | 2 | 0.28 | 0.005 | 0.013 | 0.27 | 90.8 | 4.1574 | About 2.0 times higher than sputtering film of Comparative Example 1 | — | 3.6 |
| | 6 | Nitrogen | 1800 | 30 | 2 | 0.15 | 0.009 | 0.015 | 0.28 | 89.6 | 4.1573 | About 1.5 times higher than sputtering film of Comparative Example 1 | 3.0 | 3.7 |
| | 7 | Nitrogen | 1800 | 30 | 2 | 0.33 | 0.007 | 0.024 | 0.20 | 94.3 | 4.1576 | About 2.6 times higher than sputtering film of Comparative Example 1 | — | 3.5 |
| | 8 | Nitrogen | 1950 | 30 | 2 | 0.40 | 0.011 | 0.031 | 0.15 | 96.1 | 4.1577 | About 2.8 times higher than sputtering film of Comparative Example 1 | 2.4 | 3.45 |
| Comparative Examples | 1 | Argon | 1950 | 40 | 2 | 0.006 | 0.005 | 0.015 | 0.31 | 89.5 | 4.1567 | About 0.4 times higher than sputtering film of Example 1 | 3.7 | 3.9 |
| | 2 | Nitrogen | 1950 | 40 | 2 | 0.45 | 0.9 | 0.3 | 1.8 | 91.5 | 4.1576 | *1 | 3.2 | 3.8 |
| | 3 | Nitrogen | 1800 | 20 | 2 | 0.10 | 0.08 | 0.020 | 0.33 | 86.5 | 4.1571 | About 0.2 times higher than sputtering film of Example 1 | 4.2 | 4.8 |
| | 4 | Nitrogen | 1950 | 20 | 6 | 3.5 | 0.2 | 0.042 | 0.11 | 87.5 | 4.1759 | About 0.9 times higher than sputtering film of Comparative Example 1 | — | 4.0 |

Note:
(1) In Examples 1-8 and Comparative Examples 1 and 3, a commercially available $LaB_6$ raw powder highly purified was used as the raw material of the sintered body, containing oxygen in 0.38 mass % and carbon in 0.006 mass % based on impurities with a mean particle size of 1.5 μm.

In Examples 7 and 8, the $LaB_6$ microscopic powder was used, containing oxygen in 0.7 mass % and carbon in 0.1 mass %, based on impurities, in which the mean particle size is 100 nm.

(2) In Comparative Example 2, a commercially available $LaB_6$ powder itself was used as the raw material of the sintered body. *1: The peak intensity was equivalent to that of the sputtering film of Example 1, but a large amount of impurities were contained with a crystal structure other than that of $LaB_6$ according to the thin film XRD measurement.

As seen in Table 1, any one of $LaB_6$ sintered bodies of Examples 1-8 contains nitrogen elements in 0.1 mass % or more and 3 mass % or less, and impurities other than nitrogen elements in less than 0.3 volume %, in which the relative density is 88% or more. In the sputtering films of Examples 1-8, the peak intensity ratios according to the thin film XRD measurement was about 1.5 times or more and about 2.5 times or less, compared with that of the sputtering film formed by using the $LaB_6$ sintered body as a target in Comparative Example 1, in which nitrogen elements were not solid-dispersed, exhibiting high crystallinity. Furthermore, in Examples 1-8, the work functions according to the Kelvin probe method were lower by 0.2-0.45 eV than that of Comparative Example 1. As seen in Examples 2, 6, and 8 and Comparative Examples 1-3, the order of the work functions measured by the Kelvin probe method is the same as that of the work functions measured by the vacuum UPS method. Therefore, it is predicted that each of the respective work functions of the sputtering films, corresponding to Examples 1-8 would be also lower than that of the sputtering film of Comparative Example 1 according to the vacuum UPS method.

On the other hand, in the $LaB_6$ sintered body of Comparative Example 1, the nitrogen elements are not solid-dispersed since the $LaB_6$ sintered body is sintered in argon gas. The sputtering film of Comparative Example 1 has a peak intensity ratio being about 40% of that of the sputtering film of Example 1, exhibiting low crystallinity and high work function according to the Kelvin probe method and the vacuum UPS method. In Comparative Example 2, since a commercially available $LaB_6$ powder itself is used, the obtained $LaB_6$ sintered body contains impurities other than nitrogen elements in 0.9 volume %, which is a large amount, and the sputtering film formed by using the $LaB_6$ sintered body as a target also contains a large amount of impurities other than $LaB_6$, in which the work functions are high according to the vacuum UPS method and the Kelvin probe method. In Comparative Example 3, since the sintering pressure is 20 MP, which is low, the obtained $LaB_6$ sintered body has a relative density of 86.5%, which is low, and high work function according to the vacuum UPS method and the Kelvin probe method. In Comparative Example 4, since the content of the nitrogen element is 3.5 mass %, which is high, the sputtering film formed by using the $LaB_6$ sintered body as target has a peak intensity ratio being about 90% of that of the sputtering film of Comparative Example 1, exhibiting low crystallinity and high work function according to the Kelvin probe method.

In Examples 7 and 8, two kinds of powders ($LaB_6$ powder and $LaB_6$ microscopic powder) with different mean particle sizes are used. Thus, the $LaB_6$ sintered bodies of Examples 7 and 8 have higher relative densities (94.3% and 96.1%, respectively) than those of Examples 1-6 and Comparative Examples 1-4. Furthermore, the $LaB_6$ sputtering films of Examples 7 and 8 have higher peak intensity ratios (2.6 times and 2.8 times, respectively), exhibiting high crystallinity and lower work functions (3.5 eV and 3.45 eV, respectively) according to the Kelvin probe method than those of Examples 1-6 and Comparative Examples 1-4. The work function of example 8 is 2.4 eV according to the vacuum UPS method, which is the lowest of those of Examples 1-8 and Comparative Examples 1-4.

Figure 2:
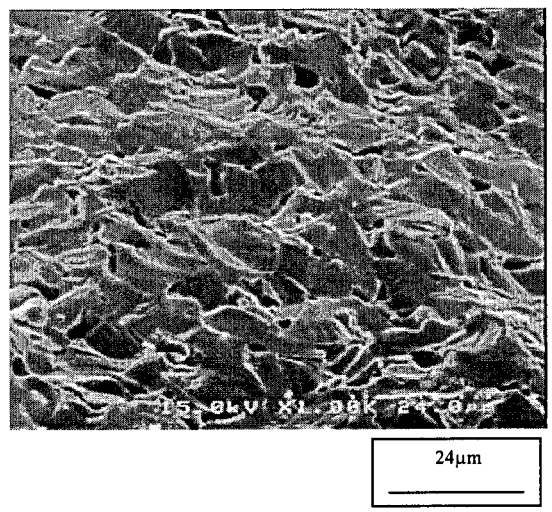
FIG. 2 shows an SEM image of the $LaB_6$ sintered body of Comparative Example 3.

FIG. 1 shows an SEM image of the $LaB_6$ sintered body of Example 1. FIG. 2 shows an SEM image of the $LaB_6$ sintered body of Comparative Example 3 with the lowest relative density of those of Examples and Comparative Examples.

INDUSTRIAL APPLICABILITY

The $LaB_6$ sintered body of the present invention has high purity and high density, which is suitable for a sputtering target and the like for manufacturing an $LaB_6$ film with excellent crystallinity and good work function.

The invention claimed is:

1. A lanthanum hexaboride sintered body comprising:
a nitrogen element; and
impurities consisting of carbon alone, at least two kinds of elements selected from the group consisting of La, C, O, and B, or both carbon and the at least two kinds of elements, in a total content of 0.3 volume % or less,
wherein a relative density of the sintered body is 88% or more, and
a total nitrogen element content in the sintered body is from 0.1 mass % to 3 mass %.

2. The lanthanum hexaboride sintered body according to claim 1, wherein said lanthanum hexaboride sintered body has a carbon content of less than 0.1 mass % and an oxygen content of less than 1.0 mass %.

3. The lanthanum hexaboride sintered body according to claim 1 or 2, wherein a lattice constant is 4.1570 Å or more and 4.1750 Å or less.

4. The lanthanum hexaboride sintered body according to claim 1, wherein said lanthanum hexaboride sintered body has a carbon content of less than 0.05 mass % and an oxygen content of less than 0.5 mass %.

5. The lanthanum hexaboride sintered body according to claim 4, wherein the total nitrogen element content in the sintered body is from 0.2 mass % to 1.0 mass %.

6. The lanthanum hexaboride sintered body according to claim 5, wherein the impurities consisting of carbon alone, at least two kinds of elements selected from the group consisting of La, C, O, and B, or both carbon and the at least two kinds of elements, are present in a total content of 0.2 volume % or less.

7. The lanthanum hexaboride sintered body according to claim 5, wherein the impurities consisting of carbon alone, at least two kinds of elements selected from the group consisting of La, C, O, and B, or both carbon and the at least two kinds of elements, are present in a total content of 0.1 volume % or less.

8. The lanthanum hexaboride sintered body according to claim 1, wherein the total nitrogen element content in the sintered body is from 0.1 mass % to 2.0 mass %.

9. The lanthanum hexaboride sintered body according to claim 1, wherein the total nitrogen element content in the sintered body is from 0.2 mass % to 1.0 mass %.

10. The lanthanum hexaboride sintered body according to claim 1, wherein the impurities consisting of carbon alone, at least two kinds of elements selected from the group consisting of La, C, O, and B, or both carbon and the at least two kinds of elements, are present in a total content of 0.2 volume % or less.

11. The lanthanum hexaboride sintered body according to claim 1, wherein the impurities consisting of carbon alone, at least two kinds of elements selected from the group consisting of La, C, O, and B, or both carbon and the at least two kinds of elements, are present in a total content of 0.1 volume % or less.

12. A target, comprising:
a lanthanum hexaboride sintered body according to claim 1 or 2.

13. A method of producing the lanthanum hexaboride sintered body of claim 1 or 2, the method comprising:
heating lanthanum hexaboride powder at a temperature of 600° C. or more and 800° C. or less in air, thereby obtaining a heated lanthanum hexaboride powder,
acid treating the heated lanthanum hexaboride powder, thereby obtaining an acidized lanthanum hexaboride powder having an oxygen content less than 1.0 mass % and a carbon content less than 0.1 mass %, and
sintering the acidized lanthanum hexaboride powder at a temperature of 1800° C. or more and a pressure of 30 MPa or more under a nitrogen gas atmosphere.

14. The method according to claim 13, further comprising:
mixing the acidized lanthanum hexaboride powder with a lanthanum hexaboride microscopic powder having a mean particle size of 50 nm or more and 500 nm or less prior to the sintering,
wherein, prior to the mixing, the acidized lanthanum hexaboride powder has a mean particle size of 1 μm or more and 5 μm or less.

15. The method according to claim 14, wherein in the mixing, a mass ratio, $M_N/M_S$, of the acidized lanthanum hexaboride powder having a mass of $M_N$ to the lanthanum hexaboride microscopic powder having a mass of $M_S$ is from 97/3 to 70/30.

16. The method of claim 14, wherein the lanthanum hexaboride microscopic powder is obtained by a process comprising:
thermally reducing lanthanum-comprising compound and a boron-comprising compound at a temperature of 1200° C. or more and 1500° C. or less in a vacuum or under an inert gas atmosphere, thereby obtaining a reduced composition, and then
decreasing an impurity in the reduced composition.

17. The method according to claim 14, wherein the lanthanum hexaboride sintered body is suitable for a target.

18. A target, comprising:
the lanthanum hexaboride sintered body according to claim 3.

19. A method of producing the lanthanum hexaboride sintered body of claim 3, the method comprising:
heating lanthanum hexaboride powder at a temperature of 600° C. or more and 800° C. or less in air, thereby obtaining a heated lanthanum hexaboride powder,
acid treating the heated lanthanum hexaboride powder, thereby obtaining an acidized lanthanum hexaboride powder, and
sintering the acidized lanthanum hexaboride powder at a temperature of 1800° C. or more and a pressure of 30 MPa or more under a nitrogen gas atmosphere,
wherein, if an oxygen content of the acidized lanthanum hexaboride powder is not less than 1.0 mass %, the method further comprises adjusting the oxygen content to less than 1.0 mass % prior to the sintering, and
if a carbon content of the acidized lanthanum hexaboride powder is not less than 0.1 mass %, the method further comprises adjusting the carbon content to less than 0.1 mass % prior to the sintering.

20. The method according to claim 19, further comprising:
mixing the acidized lanthanum hexaboride powder with a lanthanum hexaboride microscopic powder having a mean particle size of 50 nm or more and 500 nm or less prior to the sintering,
wherein, prior to the mixing, the acidized lanthanum hexaboride powder has a mean particle size of 1 μm or more and 5 μm or less.

21. The method according to claim 20, wherein in the mixing, a mass ratio, $M_N/M_S$, of the acidized lanthanum hexaboride powder having a mass of $M_N$ to the lanthanum hexaboride microscopic powder having a mass of $M_S$ is from 97/3 to 70/30.

* * * * *